Figure 1:
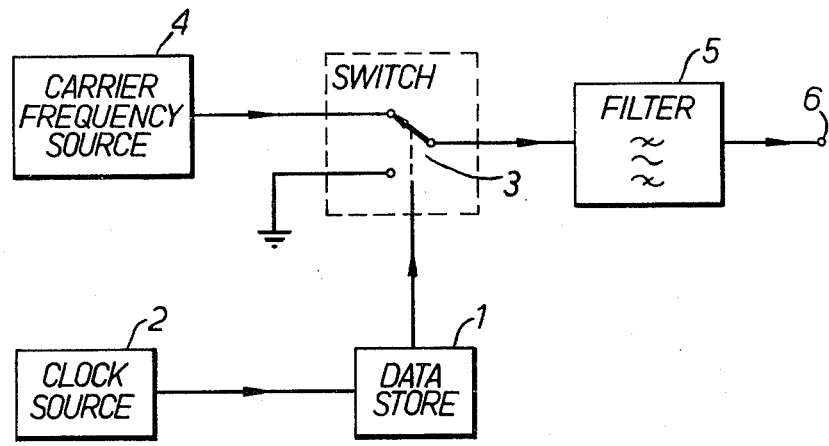

United States Patent [19]

Kikkert

[11] 4,320,361
[45] Mar. 16, 1982

[54] AMPLITUDE AND FREQUENCY MODULATORS USING A SWITCHABLE COMPONENT CONTROLLED BY DATA SIGNALS

[75] Inventor: Cornelis J. Kikkert, Hemel Hempsted, England

[73] Assignee: Marconi Instruments Limited, Chelmsford, England

[21] Appl. No.: 99,899

[22] Filed: Dec. 3, 1979

[30] Foreign Application Priority Data

Jul. 20, 1979 [GB] United Kingdom ............... 25298/79

[51] Int. Cl.³ .......................... H03C 1/00; H03C 3/00
[52] U.S. Cl. .................................... 332/16 R; 332/19; 332/31 R
[58] Field of Search ...................... 332/9 R, 9 T, 16 R, 332/16 T, 30 V, 31 R, 31 T, 19; 455/42, 108, 110, 112, 113, 119

[56] References Cited

U.S. PATENT DOCUMENTS

| 2,968,010 | 1/1961 | Case, Jr. | 332/9 R X |
| 3,401,359 | 9/1968 | Becker | 332/31 T X |
| 3,919,641 | 11/1975 | Kurokawa et al. | 332/9 R X |
| 4,068,199 | 1/1978 | Madoff | 332/19 |

*Primary Examiner*—Siegfried H. Grimm
*Attorney, Agent, or Firm*—Spencer & Kaye

[57] ABSTRACT

A modulated signal source derives its modulation information from digital data held in a data store. The digital data is arranged to operate a switch which in the case of amplitude modulation produces pulses of carrier frequency and in the case of frequency modulation introduces phase transitions into a carrier frequency. The use of the digital data and the switch enables the modulation characteristics of the signal source to be exactly predictable and reproducible and it is not degraded by non-linearities of the kind introduced by conventional mixers.

7 Claims, 3 Drawing Figures

AMPLITUDE AND FREQUENCY MODULATORS USING A SWITCHABLE COMPONENT CONTROLLED BY DATA SIGNALS

This invention relates to modulated signal sources and is particularly concerned with sources which are able to provide signals having modulation characteristics which are accurately predictable and reproducible. It is known to generate a modulated signal by mixing a carrier signal with a modulating signal, but due to the non-linearities of the operating characteristics of most mixers, the modulation properties of the modulated signal so produced cannot be readily determined in a precise manner. The present invention seeks to provide an improved modulated signal source in which this disadvantage is reduced.

According to this invention a modulated signal source includes a data store; means for reading stored data from said store under the control of a clock signal to form a digital bit stream containing a high frequency component related to the frequency of the clock signal and low frequency components related to the nature of the sequence of the digital bits in said stream; and switchable means responsive to the digital bit stream and a carrier signal to form a modulated carrier signal having a modulation characteristic which is determined by said low frequency components of said digital bit stream.

The digital bit stream can be used to generate amplitude modulation or frequency modulation.

If amplitude modulation is required, preferably the switchable means is arranged to interrupt a carrier signal applied to it so as to produce a series of carrier signal pulses in which the series corresponds to the sequence of digital bits in said stream.

Preferably the switchable means is followed by a bandpass filter having a passband centred on the carrier frequency and which is arranged to pass said low frequency components which are transposed about the centre of the carrier frequency by the action of said switchable means.

The modulation depth and frequency of the amplitude modulated signal are determined by the nature of the digital sequence held by the data store, and these properties are not degraded by the switching means, since the switchable means is not a non-linearity device providing that its switching speed is high relative to the frequency of the clock signal.

Alternatively, if frequency modulation is required, preferably the switchable means is arranged to introduce phase transitions in a carrier signal, so as to produce in the carrier signal variations in frequency which correspond to the sequence of digital bits received by said switchable means.

Preferably again the switchable means forms part of a feedback loop which also includes a variable frequency oscillator and a frequency divider.

The switchable means may be a phase adder which is arranged to directly introduce phase transitions into the feedback loop or alternatively the switchable means may comprise the frequency divider with the value of its divisor being controlled by said sequence of digital bits. Variations in the division factor provided by a variable frequency divider represent abrupt phase transitions in the feedback loop.

It will be apparent that the modulation properties of the modulated signal source are dependent on the data which is stored in the data store. Conveniently, the data store is a programmable read-only memory which is arranged to store a number of binary digits which can be read out in a predetermined sequence. The sequence of binary digits is turned into an electrical waveform by making the logic 0 and 1 levels correspond to two different voltage levels. Using Fourier analysis, it is possible to calculate the amplitude and phase of all the frequency components contained in the waveform. Suitable selection of the digits in the digital bit stream results in a sequence which has particular desired low frequency components, in addition to the high frequency components which are related to the rate at which the data is clocked out of the store. The high frequency components can be subsequently removed by filtering.

Often a repetitive waveform will be required which has a symmetry every quarter period. In this case only one quarter of the waveform need be stored. An example of such a waveform is a pure sine wave. However waveforms having other profiles which are repetitive for each quarter period can of course be stored.

The digital data can be initially generated by means of a delta sigma modulator. Modulators of this kind are known and when the required low frequency component is applied to the input of the modulator, a stream of digital bits is obtained as an output and this corresponds to the binary sequency which is stored in the data store. In practice, however, it may be more convenient to use an appropriately programmed computer to simulate the operation of a modulator. For example, it may be desired to obtain a sequence which is 2048 bits long, and which contains a sine wave with a peak-to-peak value of 80% of the voltage amplitude of the pulses in the digital bit stream. The quarter waveform which it is necessary to store is only 512 bits long and by stimulating a delta sigma modulator with a normalised input signal of 0.8 the required sequence is obtained. For the purpose of obtaining a modulation signal a suitable sequence of digital bits will contain the low frequency fundamental at the required amplitude and ideally no components up to the frequencies at which output filtering can remove unwanted frequency components.

It is possible that the first sequence obtained from calculations does not exactly satisfy the modulation requirements, in that firstly the amplitude may not be the exactly required value, and secondly the harmonic levels may be excessive. This can be corrected by slightly varying the low frequency input amplitude to the delta sigma modulator.

Figure 2:
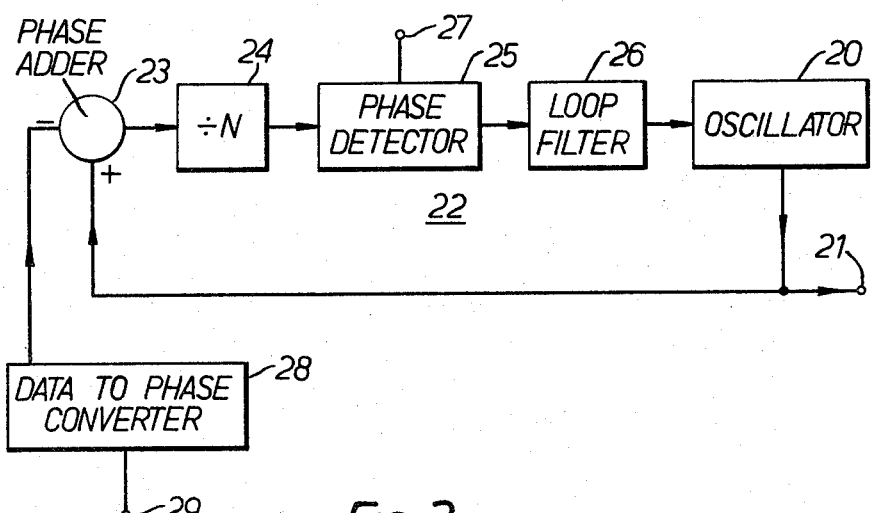
Figure 3:
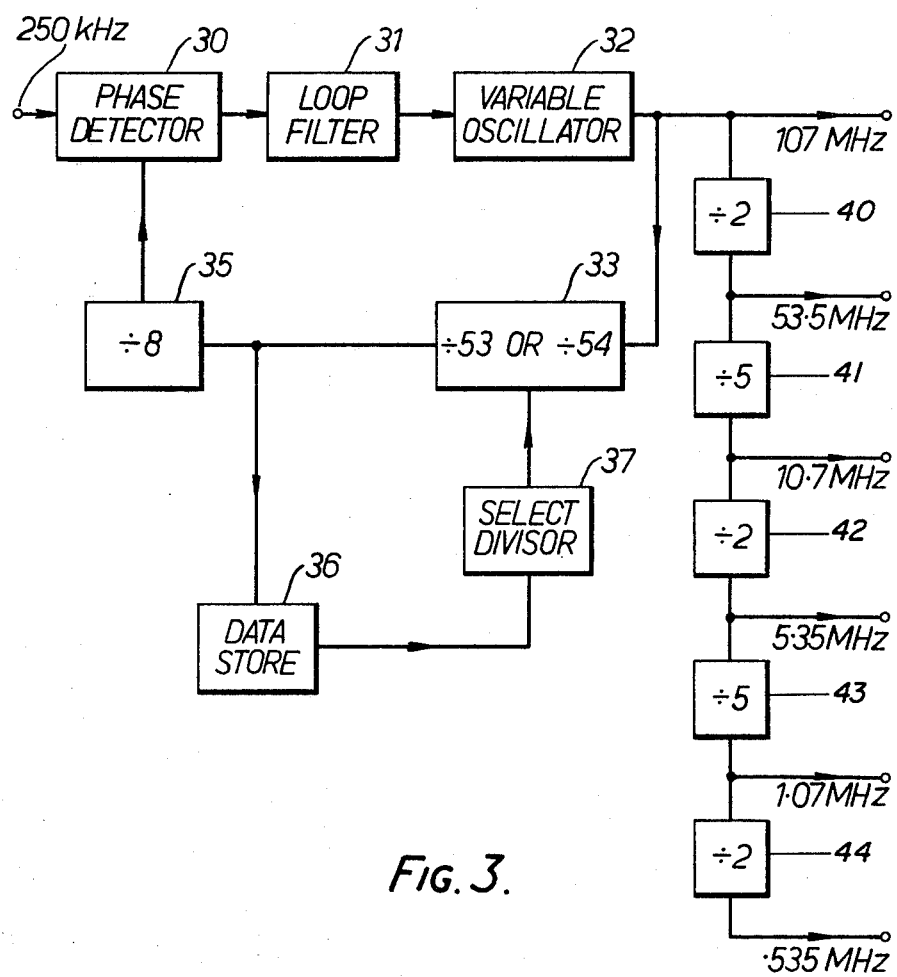

The invention is further described by way of example with reference to the accompanying drawings in which, FIG. 1 illustrates a modulation signal source in accordance with the present invention which produces an amplitude modulation signal, and FIGS. 2 and 3 illustrate corresponding embodiments of the invention which generate frequency modulation signals.

Referring to FIG. 1, a data store 1 contains digital data which has been generated by means of an appropriate delta sigma modulator as previously described. The nature of delta sigma modulation is more fully described in a paper entitled "Asynchronous Delta Sigma Modulation" by C. J. Kikkert and D. J. Miller in the Proceedings of the I R E E April, 1975 and in a paper entitled "A comparison of Code Modulation Systems" by C. J. Kikkert in the Proceedings of the I R E E, March 1975. The contents of the data store are clocked out under the action of a clock source 2 and are applied to a switch 3, which is arranged to receive a high frequency carrier signal from a carrier source 4. Under the control of the sequence of bits in the digital bit stream supplied by the data store 1 the switch 3 produces an intermittent series of pulses at carrier frequency which is applied to a pass band filter 5. Typically, a logic 1 level of the data stream will switch the carrier signal to the passband filter 5 and a logic 0 bit will switch the carrier signal to ground so that it is not received by bandpass filter 5. The waveform at the output of the switch 3 is a pulsed carrier frequency waveform which contains the required amplitude modulation waveform in addition to unwanted frequency components. The switch 3 shifts all frequency components contained in the digital bit stream so that they are centred around the carrier frequency. Thus, the desired amplitude modulation waveform can be obtained by using a simple bandpass filter centred on the carrier frequency to exclude unwanted frequency components.

The switch 3 can take many forms in practice. For example it could be a mixer (which is used as a switch and not as a linear device), an analogue relay, or a logic gate such as an AND or OR gate, but these logic gates can introduce additional low frequency components which can in principle be removed by filtering.

The operation of the circuit of FIG. 1 is further explained with reference to a specific typical example as follows. The data stored by the data store 1 is derived from a delta sigma modulator to which a normalised input amplitude of 0.80004 is applied. When the data is clocked out of the store at a particular bit rate an amplitude modulation signal is provided at output terminal 6, which has a peak-to-peak amplitude of 0.80003 multiplied by the amplitude of the carrier signal applied to the switch 3, provided that the filter 5 is so chosen that it acts as a third order Butterworth low pass filter with a cut-off frequency of seven times the frequency of the sine wave applied to the delta sigma modulator. The difference between 0.80004 and 0.80003 stems from the attenuation characteristic of the filter. In practice, of course, a low pass filter is not used, since the low frequency components are transposed so as to be arranged about the centre frequency of the carrier signal. The unwanted harmonic components which are removed by a filter of this nature are more than 70 dB below the amplitude of the applied carrier signal giving a sufficiently useful ratio for most applications.

In practice, the bandpass filter may attenuate the side bands by an amount which is slightly different from that of the carrier. For example, a relative attenuation of 0.01 dB between the carrier frequency and the side bands will cause a difference in modulation depth of 0.115%. This difference, however, is predictable and can also be measured so that it can be taken into account. From this, it will be appreciated that the design of the bandpass filter 5 is a compromise, since to achieve a small relevant attenuation between the carrier frequency and the sidebands a wide bandwidth is desirable, whereas to achieve a good rejection of unwanted frequency components a narrow bandwidth is desirable. A bandwidth of plus or minus seven times the amplitude modulation frequency as mentioned previously represents a sufficiently good compromise. Using this technique it is possible to obtain modulation depths in excess of 100%.

A frequency modulation source is illustrated in a simplified form in FIG. 2. It consists of a variable frequency oscillator 20, which provides the required frequency modulation at output terminal 21. The required control signal for the oscillator is generated within a feedback loop 22. The loop consists of a phase adder 23, the positive input of which receives the output of the oscillator 20 and the negative input of which receives a phase signal from a data-to-phase converter 28. The converter 28 receives the digital bit stream via terminal 29 from a data store which in this respect could be the same as the data store 1 and its associated clock source 2 as illustrated in FIG. 1. The operation of the converter 28 is such that a predetermined phase angle is added at the phase adder 23 when the data is a logic 1, and a predetermined phase angle is subtracted when it is a logic 0. The output of the phase adder 23 is passed via a fixed frequency divider 24 to one input of a phase detector 25. A carrier frequency reference signal of constant phase is applied to the other input of the phase detector via input terminal 27. The output of the phase detector is passed via a loop filter 26 to control the frequency of the oscillator 20. The presence of the frequency divider 24 produces a phase variation at output terminal 21, which is N times the phase of the signal applied to the negative input of the phase adder, where N is the divisor value of the variable frequency divider 24. The output phase $\phi_{OUT}$ represents the variation of phase of the output signal with respect to the carrier phase, assuming that the phase $\phi r$ of the reference signal at terminal 27 is zero.

The transfer function of the circuit shown in FIG. 2 is $$\frac{\phi_{OUT}}{\phi_M} = \frac{\frac{1}{N} \times K\phi \cdot H(s) \frac{K_v}{S}}{1 + \frac{1}{N} \times K\phi \, H(S) \frac{K_v}{S}}$$

If the loop filter 26 has the transfer function H(S) where $$H(S) = \frac{a}{S + a}, \text{ then } \frac{\phi_{OUT}}{\phi_M} = \frac{K}{S^2 + aS + K}$$

where $K = aK\phi K_v./N$

In this expression, $\phi_M$ is the phase modulation provided by the digital bit stream, N is the frequency division factor, which is an integer, $K_\phi$ is a phase detector constant and relates the difference in input phases to the output voltage of the detector, $H_S$ is the voltage transfer characteristic of the loop filter, $K_V$ is the gain constant of the oscillator and relates frequency changes to the level of the applied control voltage, S is a low pass transfer operator of the oscillator a is the cut-off frequency of the loop filter.

The reference signal present at terminal 27 has a frequency Fr and a phase $\phi r$ related to the output carrier frequency by $$F_o = NFr$$

$$\phi_o = N\phi r + \phi_{data}$$

An alternative way of producing the required phase differences is by deleting pulses from the variable oscillator in the frequency division stage and a modified circuit based on this approach is shown in FIG. 3.

Referring to FIG. 3, a carrier signal is applied to one input of a phase detector 30, the output of which is fed via a loop filter 31 to control the frequency of oscillation of a variable oscillator 32. The oscillator provides the required frequency modulation output and it is also applied via variable frequency dividers to the other input of the phase detector to constitute a closed feedback loop. Two frequency dividers 33 and 35 are provided. Frequency divider 33 is variable under the control of the output from a data store 36, which controls the operation of a control circuit 37 which selects the divisor value of the divider 33. The data store 36 is analogous to the data store 1 shown in FIG. 1. However, it need not be provided with its own clock source, and in this case a clock signal is derived from the output of the frequency divider 33 so that the clock signal is synchronised with the pulses in the feedback loop. The instantaneous value of the frequency division provided by the frequency divider 33 is dependent on whether a logic 1 level or a 0 level is obtained from the data store 36. For example a logic 1 level can be arranged to select a divisor value of 53, and a logic 0 level to select a divisor value of 54, or vice versa.

If the sequence of digital bits contained as many logic 1 levels as logic 0 levels, which is the case for waveforms with no d.c. components, then an average phase shift or $\pi$ radians occurs per clock pulse and the phase lock loop will compensate for these phase shifts by making $\phi_{OUT}=\phi_M$. The data store output also contains a low frequency waveform and provided that the transfer function of the phase lock loop passes this low frequency, the variable oscillator 32 is frequency modulated with this low frequency waveform. Additionally, the filter 31 is arranged to filter out the unwanted high frequency components which are present in the digital bit stream provided by the data store and which relate to the clock frequency. In the example shown in FIG. 3 operation of the divider 33 to give a divisor value of 54 will cause an output frequency of 108 MHz, and division by 53 will cause an output frequency of 106 MHz.

A normalised peak-to-peak amplitude waveform of 0.80003 from the example given previously will, when clocked out of the data store as a digital bit stream at the rate of 2 million bits per second, cause a peak-to-peak frequency deviation of 0.80003 times 2 MHz. This is a peak frequency deviation of 800.03 kHz.

Any attenuation of the modulating frequency by the transfer function of the phase lock loop must also be taken into account, but since the characteristic can be measured accurately, compensation can be provided to predict the exact frequency deviation that is obtained.

If the digital bit stream which is obtained from the data store 36 and which is used to delete pulses from the output of the variable oscillator 32 is clocked by means of an independent clock, quantisation will occur. Although this quantisation can be largely filtered out by the loop filter some perturbations may remain but these are avoided by obtaining the clock signal from the output of the frequency divider 33 as is illustrated in FIG. 3.

The additional frequency dividers 40 to 44 are provided so that smaller frequency deviations can be readily obtained as required. Typical frequency values are marked at the appropriate locations on FIG. 3.

I claim:

1. A modulation signal source including a data store containing predetermined reference data relating to modulation characteristics, means for repetitively and non-destructively reading stored data from said store under the control of a clock signal to form a digital bit stream containing a high frequency component related to the frequency of the clock signal and low frequency components related to the nature of the sequence of the digital bits in said stream, and switchable means responsive to the digital bit stream and a carrier signal to form a modulated carrier signal having a modulation characteristic which is determined by said low frequency components of said digital bit stream.

2. A source as claimed in claim 1 and wherein the carrier signal is amplitude modulated, and the switchable means is arranged to interrupt the carrier signal applied to it so as to produce a series of carrier signal pulses in which the series corresponds to the sequence of digital bits in said stream.

3. A source as claimed in claim 2 and wherein the switchable means is followed by a bandpass filter having a passband centred on the carrier frequency and which is arranged to pass said low frequency components which are transposed about the centre of the carrier frequency by the action of said switchable means.

4. A source as claimed in claim 1 and wherein the carrier signal is frequency modulated, and the switchable means is arranged to introduce phase transitions in the carrier signal, so as to produce in the carrier signal variations in frequency which correspond to the sequence of digital bits received by said switchable means.

5. A source as claimed in claim 4 and wherein the switchable means forms part of a feedback loop which also includes a variable frequency oscillator and a frequency divider, said switchable means, oscillator and frequency divider being connected in series in said feedback loop whereby said oscillator is modulated in accordance with said phase transitions.

6. A source as claimed in claim 5 and wherein the switchable means is a phase adder which is arranged to directly introduce phase transitions into the feedback loop, said phase adder being connected between the output of said oscillator and the input of said frequency divider for feeding the input of said oscillator to determine its frequency.

7. A source as claimed in claim 5 and wherein the switchable means is the frequency divider with the value of its divisor being controlled by said sequence of digital bits.

* * * * *